United States Patent [19]

Moeschwitzer

[11] Patent Number: 4,507,758

[45] Date of Patent: Mar. 26, 1985

[54] SEMICONDUCTOR MEMORY ELEMENT WITH TWO FIELD EFFECT TRANSISTORS

[75] Inventor: Albrecht Moeschwitzer, Dresden, German Democratic Rep.

[73] Assignee: VEB Zentrum für Forschung und Technologie Mikroelektronik im VEB Kombinat Mikroelektronik, Dresden, German Democratic Rep.

[21] Appl. No.: 384,818

[22] Filed: Jun. 3, 1982

[51] Int. Cl.³ ............................................. G11C 11/40
[52] U.S. Cl. ..................................... 365/182; 365/102
[58] Field of Search ................ 365/102, 104, 182, 189

[56] References Cited

U.S. PATENT DOCUMENTS 4,394,749  7/1983  Tsukada et al. ..................... 365/112

Primary Examiner—Terrell W. Fears

[57] ABSTRACT

This invention relates to a semiconductor memory element with two field effect transistors and an arrangement in which these elements are utilized. In accordance with the invention, a field effect transistor, transfer transistor $T_t$ is provided with a memory gate for the information memory, such memory gate being directly connected to a drain/source region of a second field effect transistor, the charging transistor $T_L$, both transistors $T_t$ and $T_L$ are connected with the write line, the second electrode of transistor $T_t$ is led to the operating voltage $U_E$, and the capacitors C2 and C2$^x$ are linked to the word line from the gates of transistors $T_t$ and $T_L$, thus obtaining a memory unit of a higher degree of integration but unimpaired readability, exceeding heretofore known reading speed.

7 Claims, 4 Drawing Figures

SEMICONDUCTOR MEMORY ELEMENT WITH TWO FIELD EFFECT TRANSISTORS

FIELD OF THE INVENTION

This invention relates to a semiconductor memory element with two field effect transistors and an arrangement in which these elements are utilized.

These memory elements are used especially in the field of integrated semiconductor memories for electronic computers and data processing systems.

BACKGROUND OF THE INVENTION

Highly integrated dynamic semiconductor memories store information as a charge on a capacitor. This basic principle has been described in U.S. Pat. No. 3,387,286. Since then, this solution has been modified several times; however, the intrinsic features of this principle can still be found in all manufactured dynamic semiconductor memory cells as a basic component of highly integrated dynamic semiconductor memories. The adavantage of such memory cells is based upon the small required space and the need for only one field effect transistor to realize the memory cell.

A further reduction of the size of the memory cell, required by ever increasing integration, results necessarily in a reduction of the stored charge. Highly sensitive sensor amplifiers are required in order to read this reduced charge; at the same time more time is needed to read the memory cell; in so far as reading may be at all still possible.

In addition, the relative sensitivity to distrubances is increased, for instance to α radiation.

OBJECT OF THE INVENTION

It is the object of the invention to produce a semiconductor memory cell with new qualitative features, thereby making possible the realization of semiconductor memories that are integrated to a maximum degree.

SUMMARY OF THE INVENTION

It is object of the invention to provide a memory cell which is not affected in its readability by its higher degree of integration and which makes it possible to exceed the heretofore known reading speed. This involves establishing an arrangement of the memory cells in relation to the semiconductor memory to devise an advantageous technical realization of the memory.

The object is achieved in accordance with the invention, in the manner that a field effect transistor, transfer transistor $T_t$, is provided with a memory gate for storing information, such memory gate being directly connected to the drain/source region of a second field effect transistor, the charging transistor $T_L$; both transistors $T_t$ and $T_L$ are connected to the bit line; the second electrode of transistor $T_t$ is led to the operating voltage $U_E$, starting from the gates of the transistors $T_t$ and $T_L$, capacitors $C2$ and $C2^X$ are linked to the word line; further, the semiconductor memory cell is enabled, read and written with only one bit line and one word line since both transistors, in their drain/source regions, are connected to the one word line, in the region of their control gates.

Control of the word selection line (word line) occurs in one modification by control voltage having two levels (high-low) and in another modification at three levels (high-medium-low).

Realization of the two capacitors $C2$ and $C2^X$ results from utilization of two poly-crystalline silicon layers, whereby flexible dimensioning of these capacitors is possible.

The standard technology of n - channel - silicon gate technology with two planes of poly-crystalline silicon layers is employed in manufacture.

DETAILED DISCLOSURE OF THE INVENTION

Figure 1:
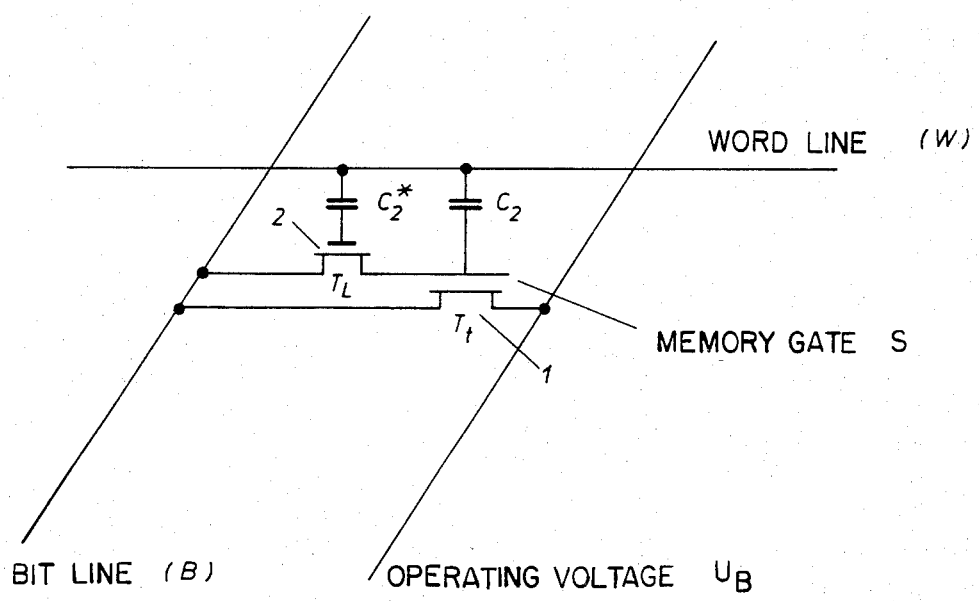
FIG. 1 is a circuit diagram of a memory cell having two field effect transistors, in accordance with the invention.

The semiconductor memory cell comprises two field effect transistors which, according to FIG. 1, are connected to a bit line for the input and output of information, a word line for selection of the memory cell for reading and writing, and the operating voltage $U_B$.

The bit line may assume the two binary levels "high" ($U_{BH}$) and "low" ($U_{BL}$). The word line W is controlled to two or three voltage levels, low ($U_{WL}$, meaning the storage cell is not addressed), medium ($U_{WM}$, the storage cell is not only to be read), high ($U_{WH}$, the storage cell is to be written, read or its contents to be refreshed).

The drain/source electrode of transistor 2 is connected to the gate of transistor 1. The two transistors 1 and 2 are connected by way of the bit line and the memory gate, thereby forming a reverse coupling, which acts as internal energy source when the word line is activated upon reading of the information in the memory element. The capacitors $C2$ and $C2^X$, which, for example, are realized in a very simple way between two poly-crystalline silicon layers, serve for setting the different switching thresholds of transistors 1 and 2 necessary for operation. The semiconductor memory element is integrated with selectible access in a matrix to provide the integrated, dynamic write-read memory. The functions of the semiconductor memory element will be explained in the next paragraphs.

Writing of the semiconductor memory element is activated by a high voltage level $U_{WH}$ on the word line, as transistor 2 is switched on and transfers the voltage level on the bit line to the gate of transistor 1. If a high voltage level $U_{BH}$ exists at the bit line, then the gate of transistor 1 is charged. This corresponds to the binary memory state H. If a low voltage level $U_{BL}$ is present at the bit line, then the gate of transistor 1 is discharged, forming the binary memory state L.

On reading, the bit line is initially discharged to a low voltage level $U_{BLL}$. Then the semiconductor memory element is activated by applying a medium voltage level $U_{WM}$ or a high voltage level $U_{WM}$ (depending on the values of the components of the memory element according to the word line, in that transistor 1 switches on, if the semiconductor memory element is placed in the binary memory state H or fails to switch on, if the semiconductor memory element is in memory state L. In the memory state H a portion of the operating voltage $U_B$ is transferred to a bit line via the switched-on transistor 1 whereby the high reading voltage level $U_{BHL}$ is formed there.

If the semiconductor memory element was in the L state, then no voltage is transferred from $U_B$ to the bit line since in this case transistor 1 will remain switched-off. The bit line remains at the low reading voltage level $U_{BLL}$.

Figure 2:
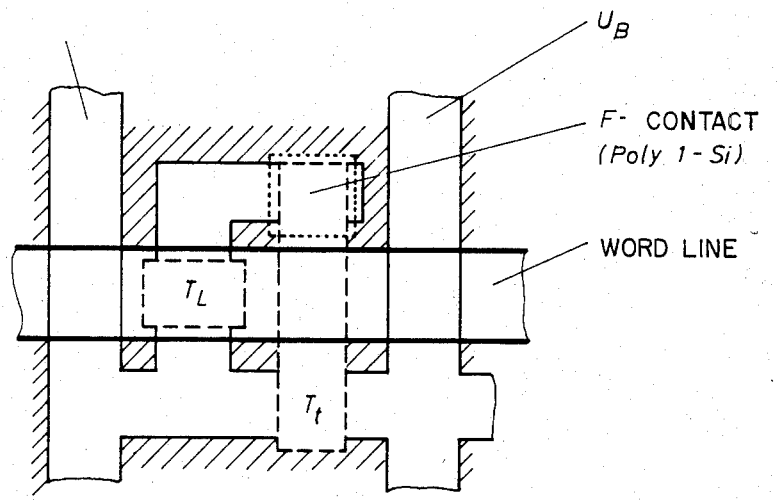
FIG. 2 is a plan view illustrating the layout of a memory cell in accordance with the invention employing small n-channel silicon gate technology with two poly-crystalline silicon planes with a diffused bit line, in accordance with a first modification of the invention.
Figure 3:
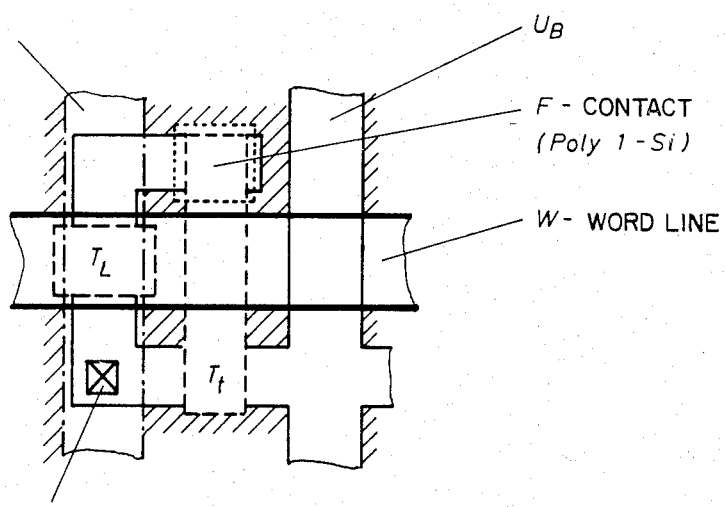
FIG. 3 is a plan view of a layout of a further modification of a memory cell employing n-channel silicon gate technology having two poly-crystalline silicon planes with a metallic bit line, in accordance with the invention.
Figure 4:
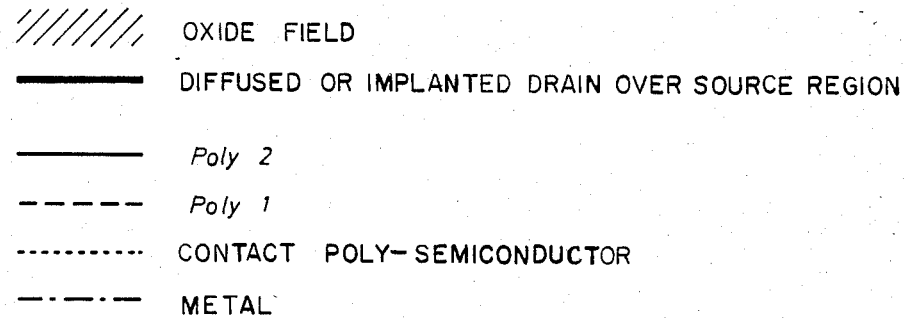
FIG. 4 is a table of legends.

FIGS. 2 and 3 show two embodiments of the invention employing standard silicon gate technology with poly-crystalline silicon layers. The two transistors are produced with gates in the poly 1-plane. The two capacitors C2 and $C2^X$ result at a crossing of the poly 2-plane and the poly 1-plane, wherein the necessary flexibility in the dimensioning of these capacitors is made possible by selection of the proportions for the surface and oxide thicknesses. The poly-2 plane forms a word line at the same time. The bit line is provided either as a diffused area (FIG. 2) or as a metallic layer (FIG. 3). One can also employ this technique for the operating voltage supply line $U_B$, which in the examples illustrated in FIGS. 2 and 3 is a diffused field. Variation 1 in FIG. 2 has the advantage that no bit line contact is required for each semiconductor memory element. Variation 2 in FIG. 3 has the advantage that the surface requirements and RC time constants of the bit line are smaller.

I claim:

1. A semiconductor memory having a bit line, a word line, an operating voltage line, and a memory cell, said memory cell comprising first and second field effect transistors and first and second capacitors coupled between the word line and the gates of the first and second field effect transistors respectively, the drain/source path of the first field effect transistor being connected between the bit line and the gate of the second field effect transistor, and the drain/source path of the second field effect transistor being connected between the bit line and the operating voltage line.

2. The semiconductor memory of claim 5 wherein said memory is comprised of polycrystalline silicon layers, said capacitors comprising polycrystalline silicon layers between said word line and the gates of the respective transistors.

3. The semiconductor memory of claim 1 wherein said first transistor functions as a loading transistor of said memory and said second transistor functions as a transfer transistor for said memory, whereby said memory may be controlled, read and written solely by said word line and bit line, said memory being controllable by control voltages having two levels as well as control voltages having three levels, applied to said word line.

4. The semiconductor memory of claim 1 wherein said first and second capacitors are comprised of two poly-crystalline silicon layers.

5. The semiconductor memory of claim 1 wherein said memory is formed by small n-channel silicon gate technology with two planes of poly-crystalline silicon layers.

6. The semiconductor memory of claim 1 wherein said bit line comprises a diffused area of said memory.

7. The semiconductor memory of claim 1 wherein said bit line comprises a metallic layer of said memory.

* * * * *